(12) United States Patent
Nagano (10) Patent No.: US 9,666,567 B2
(45) Date of Patent: May 30, 2017

(54) LIGHT EMITTING DEVICE HAVING UNDERLYING PROTECTIVE ELEMENT

(71) Applicant: NICHIA CORPORATION, Anan-shi (JP)

(72) Inventor: Hiroto Nagano, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/621,046

(22) Filed: Feb. 12, 2015

(65) Prior Publication Data

US 2015/0228872 A1   Aug. 13, 2015

(30) Foreign Application Priority Data

Feb. 13, 2014 (JP) ................. 2014-025093

(51) Int. Cl.
| H01L 33/00 | (2010.01) |
| H01L 25/16 | (2006.01) |
| H01L 33/62 | (2010.01) |
| H01L 33/56 | (2010.01) |

(52) U.S. Cl.
CPC ............ *H01L 25/167* (2013.01); *H01L 33/56* (2013.01); *H01L 33/62* (2013.01); *H01L 2224/73204* (2013.01)

(58) Field of Classification Search
CPC .................................................... H01L 25/157
USPC ......................................................... 257/98
See application file for complete search history.

(56) References Cited

U.S. PATENT DOCUMENTS

| 2006/0071330 A1* | 4/2006 | Suminoe ........... H01L 23/49811 257/723 |
| 2006/0097368 A1 | 5/2006 | Seko |
| 2009/0090926 A1* | 4/2009 | Wang .................... H01L 25/167 257/99 |
| 2013/0200528 A1* | 8/2013 | Lin ..................... H01L 21/6836 257/774 |
| 2013/0240922 A1* | 9/2013 | Yamamoto .......... H01L 25/0753 257/89 |
| 2014/0301054 A1* | 10/2014 | Nagai .................... H01L 33/62 361/761 |

FOREIGN PATENT DOCUMENTS

| JP | 2006-041401 A | 2/2006 |
| JP | 2006-108284 A | 4/2006 |
| JP | 2006-165517 A | 6/2006 |
| JP | 2007-081141 A | 3/2007 |
| JP | 2012-015438 A | 1/2012 |
| JP | 2012-174979 A | 9/2012 |
| JP | 2013-122951 A | 6/2013 |
| JP | 2013-219071 A | 10/2013 |
| JP | 2014-026993 A | 2/2014 |

(Continued)

*Primary Examiner* — Matthew Gordon
(74) *Attorney, Agent, or Firm* — Foley & Lardner LLP (57) ABSTRACT

A light emitting device includes a base member; a light emitting element disposed on the base member via at least one first electrically conductive joining member such that a space is located between the light emitting element and a surface of the base member; and a protective element disposed on the base member via at least one second electrically conductive joining member. The protective element is located in the space. A light reflecting resin is located in the space and covers the protective element.

22 Claims, 9 Drawing Sheets

(56) References Cited

FOREIGN PATENT DOCUMENTS

| JP | 2014-086630 A | 5/2014 |
|----|---------------|--------|
| KR | 100769720 B1 | 10/2007 |
| WO | WO-2012/063459 A1 | 5/2012 |

* cited by examiner

LIGHT EMITTING DEVICE HAVING UNDERLYING PROTECTIVE ELEMENT

CROSS REFERENCE

This application claims priority to Japanese Patent Application No. 2014-025093 filed on Feb. 13, 2014. The entire disclosure of Japanese Patent Application No. 2014-025093 is hereby incorporated herein by reference.

BACKGROUND

1. Technical Field

The present disclosure relates to a light emitting device.

2. Background Art

A light emitting device may be provided with a protective element such as a Zener diode to prevent damage to the light emitting element used in the device caused by static electricity or high-voltage surge. However, such a protective element may have a low reflectance which may lead to a reduction in the luminous efficiency. Hence there has been provided a structure in which the protective element is covered with a reflecting layer to prevent the reduction in the luminous efficiency (see JP 2012-174979A).

With the aim of reducing the stress in the mounting region of the protective element, there have also been proposed such structures in which a protective element is incorporated in the body of the base material (JP 2013-122951A), or in which a recess is formed in the base material, a protective element is disposed in the recess, and a light emitting element is arranged above the protective element (KR 10-10769720B).

In the configuration according to JP2012-174979A, a light emitting element and a protective element are disposed adjacent to each other, so that the whole element-mounting region is a sum of the planar dimensions of the light emitting element and the protective element and thus miniaturization of the light emitting device cannot be attained.

In the configuration according to JP 2013-122951A, a light emitting element and a protective element are disposed on both sides of a circuit substrate respectively, which complicates the manufacturing process.

With the configuration according to KR 100769720B, a resin is difficult to fill in the recess of the base material, which makes voids likely to occur in the resin. In the configuration according to JP2014-26993A, absorption of the light emitted from a light emitting element by a constant-voltage diode may lead a reduction in the light extraction efficiency.

SUMMARY

Embodiments of the present invention have been devised in light of such circumstances, and it is hence an object embodiments of the present invention to provide a light emitting device in which reduction in the light extraction efficiency due to the light absorption by the protective element can be suppressed while enabling downsizing of the light emitting device.

Accordingly, a light emitting device according to an embodiment of the present invention includes a base member, a light emitting element disposed on the base member via a first electrically conductive joining member so as to create a space between itself and a surface of the base member, and a protective element disposed on the base member via a second electrically conductive joining member. The protective element is arranged in the space and a light reflecting resin is arranged in the space to cover the protective element. Also, a light emitting device according to an embodiment of the present invention includes a base member, a light emitting element disposed on the base member via a first electrically conductive joining member, and a protective element disposed on the base member via a second electrically conductive joining member. The first electrically conductive joining member has a height greater than a height of the protective element.

The present invention can provide a light emitting device in which reduction in the light extraction efficiency due to absorption of light by a protective element can be suppressed while enabling downsizing of the light emitting device.

DETAILED DESCRIPTION OF THE INVENTION

The sizes and the arrangement relationships of the members in each of drawings are occasionally shown exaggerated for ease of explanation. In the description below, the same designations or the same reference numerals denote the same or like members and detailed descriptions will be appropriately omitted. Description given in one example and one embodiment can also be applied in other examples and embodiments.

A light emitting device according to an embodiment of the present invention includes a base member, a light emitting element, a protective element, a first electrically conductive joining member, a second electrically conductive joining member, and a light reflecting resin. The light emitting device may be either a side-view type or a top-view type, but particularly, a light emitting device of a top-view type is preferable.

Preferable embodiments according to the present invention will be described below with reference to the drawings. The figures are schematic representatives, and the configurations, sizes, ratios, shapes etc., may differ from the actual state.

First Embodiment

Figure 1:
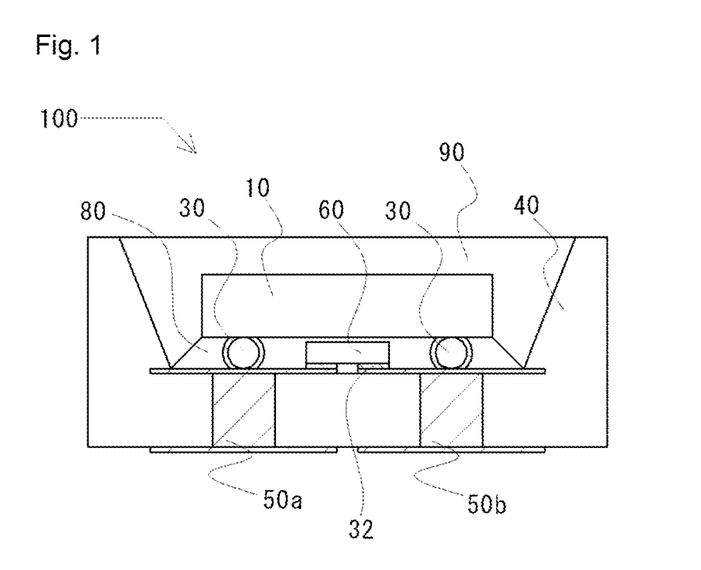
FIG. 1 is a schematic cross-sectional view of a light emitting device according to an embodiment.
Figure 2:
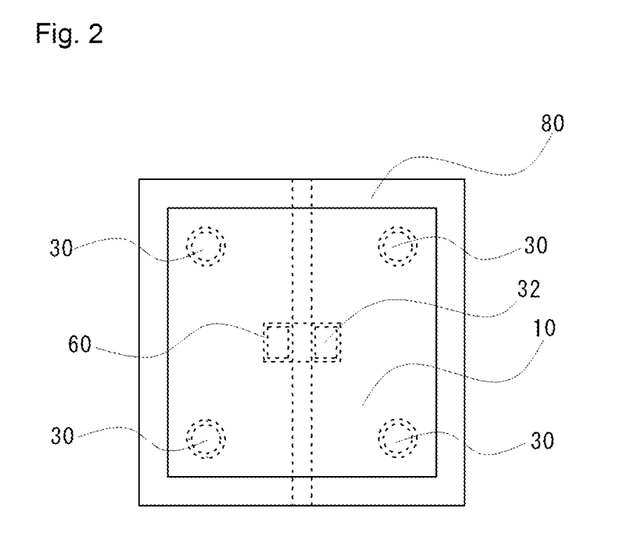
FIG. 2 is a schematic plan view of a light emitting device according to an embodiment.

FIG. 1 is a schematic cross-sectional view of a light emitting device 100 according to a first embodiment of the present invention. FIG. 2 is a schematic plan view, taken in the vicinity of the light emitting element 10 of the light emitting device 100 shown in FIG. 1. The light emitting device 100 according to the present embodiment has the electrically conductive wirings 50a, 50b on a surface and inside of a base member 40, first electrically conductive joining members 30 arranged for maintaining a certain space between a surface of the base member 40 and a lower surface of the light emitting element 10, a protective element 60 arranged in the space between the electrically conductive joining members 50a, 50b and the light emitting element 10, and a light reflecting resin 80 filled in the space to cover the protective element 60.

The protective element 60 is positioned directly under the light emitting element 10, so that the whole element mounting region can be arranged only in the mounting region of the light emitting element.

Moreover, the light emitting element 10 and the protective element 60 are mounted on the same surface of the base body 40, allowing for simplifying the manufacturing process.

Further, the location for arranging the protective element 60 does not have a recessed configuration, so that voids are hardly generated at the time of filling a resin such as a light reflecting resin.

Constituent components of the light emitting device will be described in detail below.

(Base Member 40)

The light emitting device has a base member for mounting a light emitting element. The base member is generally made of an insulating material such as a glass epoxy, a resin, or ceramics (HTCC, LTCC), or a composite material of an insulating material and a metal member. For the base member, ceramics or a thermosetting resin which have high heat-resistant property and weather-resistant property is preferably used. Examples of the ceramics material include alumina, aluminum nitride, mullite and so forth. The base member may be made by combining an insulating material such as a BT resin, a glass epoxy, an epoxy-based resin, or the like with such a ceramics material. As the thermosetting resin, an epoxy resin, a triazine derivative epoxy resin, a modified epoxy resin, a silicone resin, a modified silicone resin, an acrylate resin, a urethane resin, or the like, can be used. Among those, a triazine derivative epoxy resin is more preferably used.

The shape of the base member is not specifically limited, and the shape may be a plate-like shape with flat surfaces, or may be such a plate-like shape with its upper portion formed in a reflector-like shape with slanted surfaces as shown in FIG. 1, which is attached or integrally formed. The reflector-like portion can be made of the same material as that of the plate-like base member, or may be made of different material. Providing such slanted surfaces allows the light emitted from the light emitting element in a lateral direction to be efficiently extracted in an upward direction.

The base member generally has electrically conductive wirings, which are connected respectively to the light emitting element, on the surface and/or inside of the base member. Examples of the electrically conductive wiring include a wiring pattern and a lead frame disposed on or in the base member. The wiring pattern can be made of a metal such as copper, aluminum, gold, silver, tungsten, iron, nickel, or an alloy such as an iron-nickel alloy and phosphor bronze. In the case where a wiring pattern is disposed on the surface, reflecting plating may be applied on the surface in order to efficiently extract light from the light emitting element which to be mounted. The wiring pattern may be bent or deformed on the surface or inside the base member. The wiring pattern has a thickness of, for example, several micrometers to several hundred micrometers.

The lead frame can be made of, for example, aluminum, iron, nickel, copper, a copper alloy, a stainless steel, or an invar alloy. Also, a cladding material which is formed by cladding dissimilar metals can be used. Plating of gold, silver, nickel, palladium, or an alloy of those is preferably applied on those lead frames. The lead frame has a thickness of, for example, several tens of micrometers to a thousand micrometers. For the base member as described above, any appropriate base member known in the art and used for mounting a light emitting element or the like can be employed.

The electrically conductive wiring is used not only for establishing electrical connection with the light emitting element but also used for other functions, such as for mounting the light emitting element or the protective element, for improving heat dissipating performance, and for establishing electrical connection with the protective element. Accordingly, the base member may have not only a pair of positive and negative electrically conductive wirings but also one or more electrically conductive patterns corresponding to the electrically conductive wirings.

(Light Emitting Element 10)

A light emitting element used in an embodiment is a so-called light emitting diode. Such a light emitting element has a structure in which a stacked-layer structure that includes a light emitting layer is stacked on a substrate. Specific examples thereof include elements with light emitting layers made of various semiconductors, for example, a nitride-based semiconductor such as InN, AlN, GaN, InGaN, AlGaN, InGaAlN, Group III-V compound semiconductors, and Group II-VI compound semiconductors. After the stacked-layer structure is formed, the substrate may be removed.

The light emitting element may have the positive and negative electrodes disposed respectively on the opposite surfaces, or may have the positive and negative electrodes disposed at a same surface side. Each one of the positive and negative electrodes may be provided, or two or more electrodes may be provided respectively.

The material, the thickness, and the structure of the electrodes are not specifically limited. For example, a single layer structure or a stacked layer structure respectively containing gold, copper, lead, aluminum, or an alloy of those can be used. On the surfaces of the electrodes, a single layer or a stacked layer of metals or an alloy of Ni, Ti, Au, Pt, Pd, and W may be formed. The thickness of the electrodes is not specifically limited, but of those, Au is preferably disposed on a final layer (at the outermost side) with a thickness of about 100 nm or more.

The light emitting element is fixed to the base member through the first electrically conductive joining member. In the case of using a light emitting element which has the positive and the negative electrodes on a same surface side, mounting in either a face-up manner or a flip-chip manner can be used, but flip-chip mounting is preferable. In this case, as shown in FIG. 1, the positive and negative electrodes of the light emitting element 10 are arranged respectively facing the electrically conductive wirings 50a, 50b and joined through the first electrically conductive joining members 30. With a flip-chip mounting, electrical connection between the light emitting element 10 and the electrically conductive wirings 50a, 50b can be established through the first electrically conductive joining members 30, which eliminates necessity of wire-bonding, so that a light emitting device of smaller size can be obtained.

In the case of using a light emitting element which has positive and negative electrodes respectively on opposing surfaces, the surface provided with one of the electrodes (hereinafter may be referred to as a first surface or a back surface) may be placed on an electrically conductive wiring of a base member, and then, through a first electrically conductive joining member, fixed to the base member. With this arrangement, the electrodes placed on the back surface can be electrically connected to the electrically conductive wirings, respectively.

The other surface (hereinafter may be referred to as a second surface or an upper surface) provided with the other electrode (hereinafter may be referred to as a second electrode) is arranged facing the opposite side from the base member, and generally, the second electrode is electrically connected to the electrically conductive member through a wire.

In the light emitting device according to an embodiment, a single light emitting element may be mounted in a single light emitting device, or a plurality of light emitting elements may be mounted in a single light emitting device. In the case that a plurality of light emitting element are mounted, the type of connection of the light emitting elements is not specifically limited. For example, connection in parallel, in series, or in series-parallel can be employed. With mounting a plurality of light emitting elements, the light emitting area can be increased and thus the luminous flux can be improved.

(First Electrically Conductive Joining Member 30)

The first electrically conductive joining member is not specifically limited as long as it can create a space between the lower surface of the light emitting element and the base member. It is preferable that upon applying heat, the first electrically conductive joining member can easily be made available for joining while maintaining its predetermined shape so as to maintain the space even after heating. For such an electrically conductive joining member, so-called Cu-core balls are preferably used. The Cu-core balls are spherical, allowing easy placement. For example, with the use of an adsorption jig, the balls are collectively adsorbed and then placed. As another example, with the use of a mask which has circular openings, the balls are collectively deposited through the openings. These methods allow for the production rate to be improved.

Figure 3:
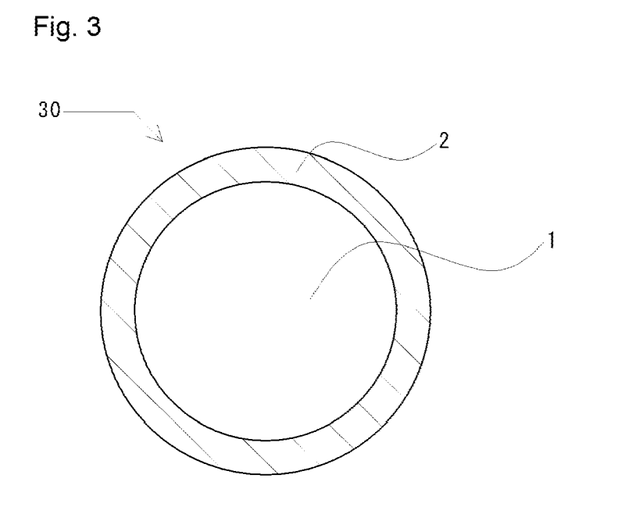
FIG. 3 is a schematic cross-sectional view of a first electrically conductive joining member for a light emitting device according to an embodiment.

The first electrically conductive joining member may be arranged in a plural number with respect to a single electrode of a light emitting element, or may be arranged in a plural number with respect to a single electrically conductive wiring. FIG. 3 is a schematic cross-sectional view of a first electrically conductive joining member 30 used in the present embodiment. AS shown in FIG. 3, the first electrically conductive joining member has a core ball (hereinafter may be referred to as a "core"), and a coating 2 outside of the core 1. The coating 2 is connected to an electrically conductive wiring provided on the base member. The coating 2 is preferably connected to the electrically conductive wiring through eutectic bonding. In the case where the first electrically conductive joining member 30 has a ball shape, a concave shape corresponding to the curved surface of the ball is formed on the electrically conductive wiring side, thus, the Cu-core balls can be placed with good positioning accuracy.

The melting point of the core is preferably higher than the melting point of the coating. The shape of the core is not limited to a ball-shape as shown in FIG. 3 and a desired shape can be employed. More specifically, it is preferable that the core contains copper as its main component, and the coating is made of an alloy which contains Au and at least one of Si, Ge, and Sn. It is further preferable that a predetermined base film is deposited onto the entire surface of the core and a Sn-based film is deposited onto the base film. For the base film, Ni, Ni—B, Ni—P, or the like, can be used. The Sn-based film may be a single layer of a Sn-based alloy or a multilayer film of Sn and other alloy component or a Sn alloy. In the case of employing a multilayer film of Sn and other alloy component or a Sn alloy, in the reflow operation to create a bump formed with a Cu-core ball, Sn and other alloy component or a Sn alloy are melted and diffused into each other to form a uniform alloy layer.

It is preferable that a main component of the core is Cu (that is, the content of Cu is 50% by weight or more). Particularly, it is preferable to use a ball with a Cu content of 99% by weight or more, or a ball made of an alloy of Cu and one or more of Zn, Sn, P, Ni, Au, Mo, and W, because of excellent thermal conductive property and electric conductive property. Moreover, those are not melted by the heat at the time of eutectic bonding, which allows maintaining the space. With a too low content of Cu, the high thermal conductive property and electric conductive property, which are advantageous properties of Cu, may not be exhibited.

The core preferably has a ball shape and preferably has a diameter of 1 μm to 1000 μm. A core ball which has a smaller diameter than the above may be difficult to handle. With a diameter of greater than 1000 μm, miniaturization of the light emitting device may become difficult. Accordingly, a diameter of 40 μm to 200 μm is preferable. The core 1 preferably has a height higher than the height of the protective element 60. Preferably, the coating 2 has a thickness of about 1 μm to about 50 μm, and more preferably, 1 μm to 10 µm. The first electrically conductive joining member preferably has a height higher than the height of the protective element 60 to be described below. In the case where the coating 2 is made of Sn, the thickness is preferably 1 µm to 50 µm. With a thickness less than the range, it may be insufficient as a solder. With a thickness of greater than 50 µm, it is too large with respect to the Cu ball, which may result in melt outflow which may contact with adjacent electrode or bump at the time of forming a bump.

In the present embodiment, a light reflecting resin is filled in the space created by the first electrically conductive joining member. For this reason, the first electrically conductive joining member is preferably arranged to secure the resin passage. For example, as shown in FIG. 2, the first electrically conductive member is preferably arranged at each of the four corners of a rectangular light emitting element. The first electrically conductive joining member has a ball shape (spherical shape), which facilitates filling of the resin in the portion where the light emitting element and the base member contact each other.

(Protective Element 60)

A protective element 60 is disposed in the space between the lower surface of the light emitting element and the upper surface of the base material. The protective element 60 may be any known element mounted in a light emitting device. Examples thereof include an element which can short-circuit the inverse voltage applied on the light emitting element, or which can short-circuit a forward voltage greater than a predetermined voltage that is higher than the operating voltage of the light emitting element. For example, an overvoltage protection element, an overcurrent protection element, a circuit protection element, an electrostatic protection element, etc., can be used. More specifically, a Zener diode, a protective diode for transistor, etc., can be used. A protective element having two electrodes on a same surface side which allows flip-chip mounting is preferable.

(Second Electrically Conductive Joining Member 32)

The protective element is bonded under the light emitting element to the base member via a second electrically conductive joining member. Particularly, electrical connection between the protective element and the electrically conductive member is preferably established via the second electrically conductive joining member. For the second electrically conductive joining member, for example, a SnPb-based, a SnAgCu-based, an AuSn-based, a SnZn-based, or a SnCu-based material can be preferably used. Among those, an AuSn-based eutectic is preferable. Also, optionally, Bi, In, or the like may be added to such a material in order to improve the wettability or solder cracking.

(Light Reflecting Resin 80)

A light reflecting resin is disposed to cover the protective element mounted between the base member and the light emitting element. Covering the protective element with the light reflecting resin allows for suppressing absorption of light from the light emitting element by the protective element. The light reflecting resin is to cover at least the protective element, but is preferably disposed in contact with the light emitting element, the base member, the protective element, and the first electrically conductive joining member so as to fill the space between the lower surface of the light emitting element facing the base member and the upper surface of the base member. The light reflecting resin may be disposed in contact with not only the bottom surface but also the side surfaces of the light emitting element. The light reflecting resin preferably covers not only the lower portion of the light emitting element but also the base member at outside region of the light emitting element and the upper surfaces of the electrically conductive wirings formed in the base member.

The light reflecting resin is preferably made of a reflecting material which has a reflectance of 60% or greater, more preferably 70%, 80%, or 90% or greater, to light from the light emitting element. Examples of the reflecting material include a ceramic, a resin, a dielectric, a pulp, or a glass, or a composite material of those. Of those, a resin is preferable in view of easiness in molding into a desired shape.

For such a resin, a thermosetting resin, a thermoplastic resin, or the like, can be used. More specifically, a resin or a hybrid resin which contains at least one of a silicone resin, a modified silicone resin, an epoxy resin, a modified epoxy resin, and an acrylic resin can be used.

Also, it is preferable that a light-reflecting member, a light-scattering material, or a coloring agent such as titanium dioxide, silicon dioxide, zirconium dioxide, potassium titanate, alumina, aluminum nitride, boron nitride, mullite, niobium oxide, barium sulfate, carbon black, various rear-earth oxides (for example, yttrium oxide, gadolinium oxide) is contained in those materials, such as a resin. Also, fibrous filler such as glass fiber or wallastonite, inorganic filler such as carbon black, or a material with high heat dissipation properties (for example aluminum nitride) may be included. Those light-reflecting members or the like can be included in an amount of about 5 to 60% based on the total weight of the light-reflecting members, for example.

(Light-Transmissive Layer 90)

The light emitting element may be optionally covered with a light-transmissive layer. The light-transmissive layer is for allowing light emitted from the light emitting element to pass through. It is preferable to employ a light-transmissive layer which allows a 60% or greater portion of light emitted from the light emitting element to pass through; further, a 70%, 80%, or 90% or greater portion of the light to pass through is preferable. Such a layer can be made of, for example, a silicone resin, a modified silicone resin, an epoxy resin, a phenol resin, a polycarbonate resin, an acrylic resin, a trimethyl pentene resin, a polynorbornene resin, or a hybrid resin which contains one or more of those resins, or a glass.

In the light transmissive layer, a fluorescent material and/or a light-diffusion agent may be contained.

(Fluorescent Material)

For the fluorescent material, a known material in the art can be used. Specific examples of the fluorescent material include a yttrium aluminum garnet (YAG)-based fluorescent material activated with cerium, a lutetium aluminum garnet (LAG)-based fluorescent material activated with cerium, a nitrogen-containing calcium aluminosilicate (CaO—$Al_2O_3$—$SiO_2$) activated with europium and/or chromium, a silicate ($(Sr,Ba)_2SiO_4$)-based fluorescent material activated with europium, a β-sialon-based fluorescent material, nitride-based fluorescent materials such as a CASN-based fluorescent a material and a SCASN-based fluorescent material, KSF-based fluorescent material ($K_2SiF_6$:Mn), and a sulfide-based fluorescent material. In the case where the light emitting device is used for the backlight of liquid crystal display or the like, a fluorescent material which is excited by a blue light and emits a red light (for example, a KSF fluorescent material) and a fluorescent material which is excited by a blue light and emits a green light (for example, a β-sialon-based fluorescent material) are preferably used. With this arrangement, the color reproduction range of the display which used the light emitting device can be expanded. In the case where the light emitting device is used for lighting, a light emitting element to emit blue-green light and a red fluorescent material can be used in combination.

The fluorescent material preferably has a median particle diameter of 50 µm or less, for example. The median particle diameter can be measured and calculated by using a commercially available particle measuring instrument or particle distribution measuring instrument. Particularly, in the case where a YAG etc., is used as the fluorescent material, a bulk body (for example, a plate-like body) which is made by highly uniformly dispersing the superfine particles of such a fluorescent material and sintering it, is preferably used. With a single crystal structure and/or a polycrystalline structure obtained according to such conditions, voids and impurity layers can be reduced and high transparency can be secured.

The fluorescent material can be a luminescent substance such as so-called nanocrystal light emitting substance or quantum dot light emitting substance. Examples of the material thereof include, a semiconductor material such as a group II-VI semiconductor, a group III-V semiconductor, and a group IV-VI semiconductor, more specifically, high dispersion particles of nano size made of CdSe, core-shell type $CdS_xSe_{1-x}$/ZnS, and GaP. Such fluorescent materials may have a particle diameter of about 1 µm to about 20 µm (corresponding to 10 to 50 atoms). With the use of such fluorescent materials, internal scattering can be reduced and the transmittance of light can be further improved. Typically, the quantum dot fluorescent materials are chemically unstable, so that surface modification or stabilizing may be applied with the use of a resin such as PMMA (polymethyl methacrylate). Such a fluorescent material may be formed in a bulk (for example, a plate-like body), in which a fluorescent material is mixed in a transparent resin (for example, an epoxy resin or a silicone resin) and molded, or in a plate-like body in which a fluorescent material is sealed between the glasses with a transparent resin.

(Method of Manufacturing)

Next, a method of manufacturing a light emitting device 100 according to the present embodiment will be described with reference to FIG. 4A through FIG. 6D. FIGS. 4A to 5E are schematic cross-sectional views illustrating a method of manufacturing a light emitting device according to the present embodiment. FIGS. 6A to 6D are schematic plan views illustrating a method of manufacturing a light emitting device according to the present embodiment.

(Providing Light Emitting Element)

Figure 4A:
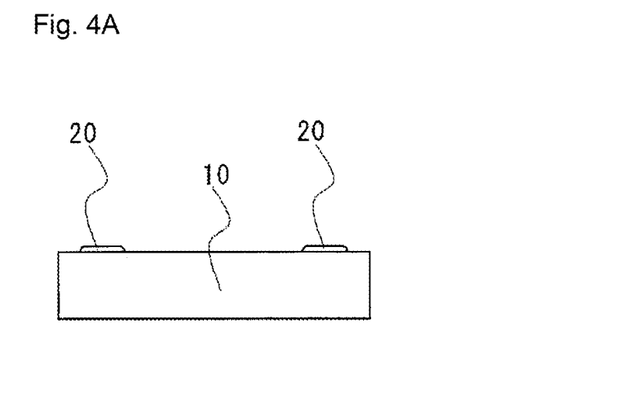
FIGS. 4A to 4C are schematic cross-sectional views illustrating a method of manufacturing a light emitting device according to an embodiment, FIG. 4A showing a flux applied on electrodes of a light emitting element, FIG. 4B showing a first electrically conductive joining member placed on each flux, FIG. 4C showing the light emitting element joined to the first electrically conductive joining member.

First, as shown in FIG. 4A, a flux 20 is applied on the electrodes of the light emitting element 10. The coating of the flux can be applied by using pin-transfer printing method or mask printing method.

Figure 4B:
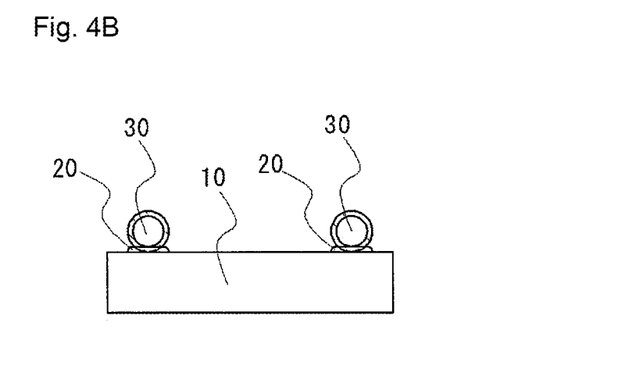

Next, as shown in FIG. 4B, a first electrically conductive joining member 30 is placed on each flux 20 applied on the electrodes of the light emitting element 10. For the placing, a desired method can be used, such as a method in which placement is performed by using a suction jig, or a method in which the first electrically conductive joining member 30 is dropped in an opening provided in a mask in conformity to the position on the electrode pattern.

Then, heat is applied to join the light emitting element 10 and the first electrically conductive joining member 30. The heating is preferably performed in an inert atmosphere such as in nitrogen gas.

(Providing Base Member)

Figure 5A:
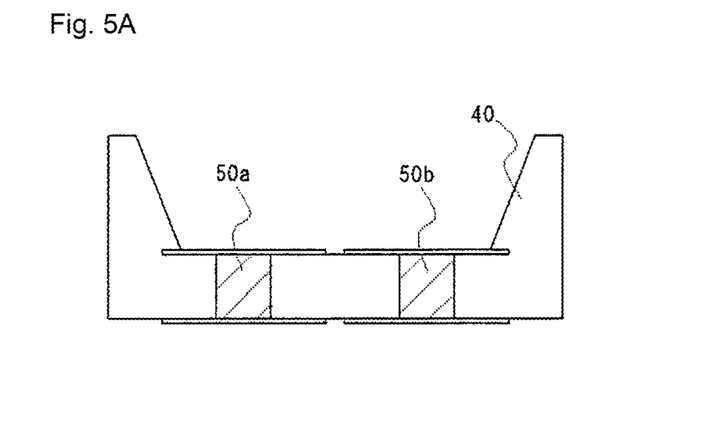
FIGS. 5A to 5E are schematic cross-sectional views illustrating a method of manufacturing a light emitting device according to an embodiment, FIG. 5A showing a base member with a pair of positive and negative electrically conductive wirings disposed thereon, FIG. 5B showing a protective element placed on the electrically conductive wirings via a second electrically conductive joining member, FIG. 5C showing a light emitting element placed above the protective element and on the electrically conductive wirings via flux, FIG. 5D showing a light reflective resin filled in the space between the light emitting element and the electrically conductive wirings, and FIG. 5E showing a light-transmissive layer formed in the recess of the base member.
Figure 6A:
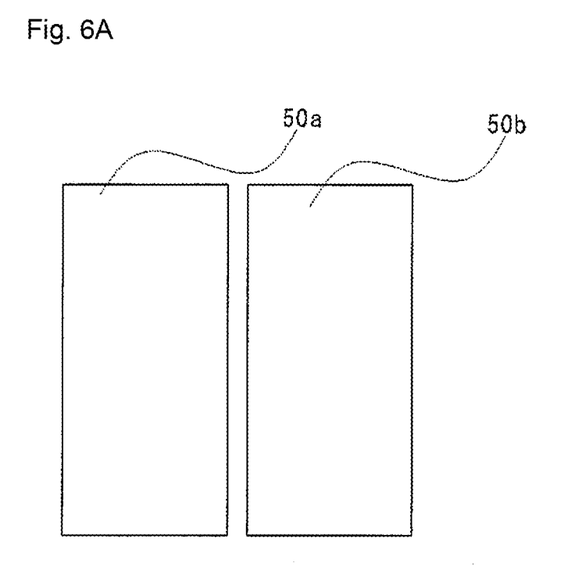
FIGS. 6A to 6D are schematic plan views illustrating a method of manufacturing a light emitting device according to an embodiment, FIG. 6A showing a base member with a pair of positive and negative electrically conductive wirings disposed thereon, FIG. 6B showing a protective element placed on the electrically conductive wirings via a second electrically conductive joining member, FIG. 6C showing a light emitting element placed above the protective element and on the electrically conductive wirings via flux, and FIG. 6D showing a light reflective resin filled in the space between the light emitting element and the electrically conductive wirings.

Next, as shown in FIG. 5A and FIG. 6A, a base member 40 with a pair of positive and negative electrically conductive wirings 50a, 50b disposed thereon is provided. The electrically conductive wirings 50a, 50b can be formed on a surface of the base member or inside the base member by using a known method with a known material.

(Mounting Protective Element)

Figure 5B:
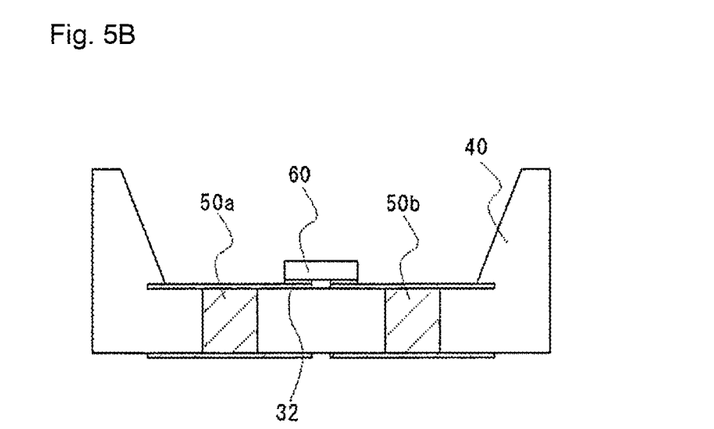
Figure 6B:
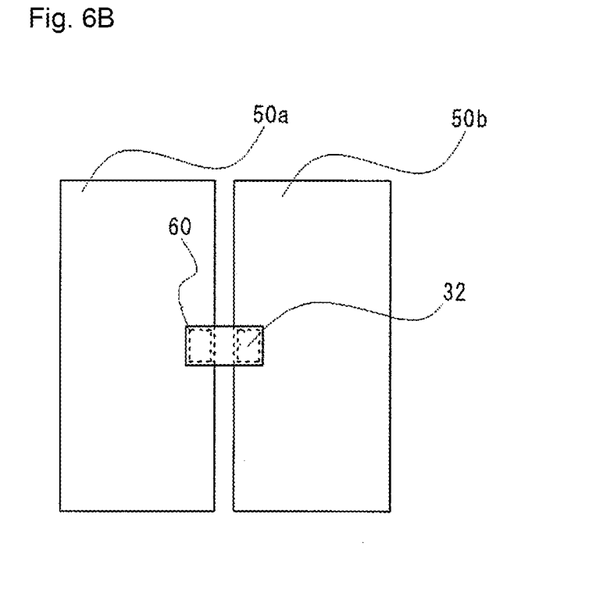

Then, as shown in FIG. 5B and FIG. 6B, a protective element 60 is placed on the electrically conductive wirings 50a, 50b via a second electrically conductive joining member 32. For placing, a flip-chip method, a die-bonding method, or the like, can be used. As shown in FIG. 5B, placing in a flip-chip manner allows for establishing electrical connection with the electrically conductive wirings 50a, 50b, and thus preferable.

(Mounting Light Emitting Element)

Figure 4C:
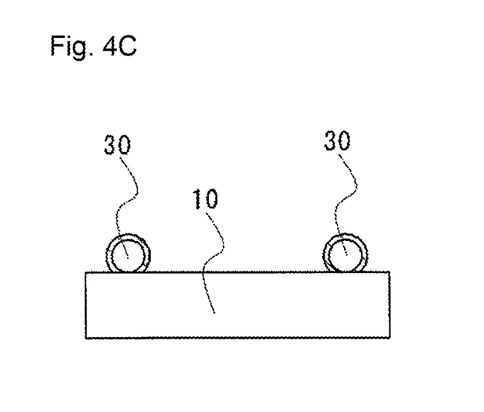
Figure 5C:
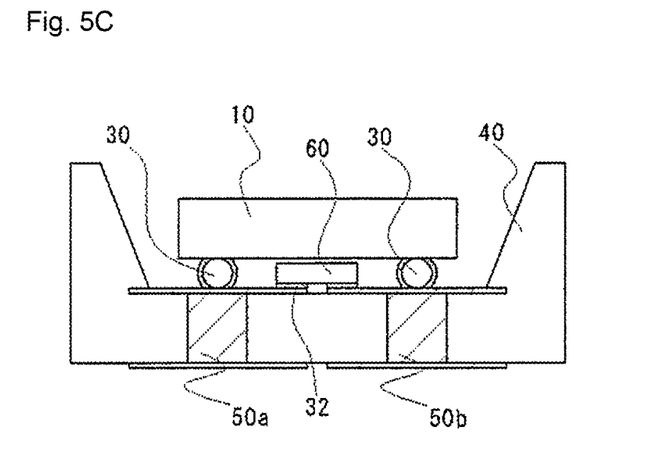
Figure 6C:
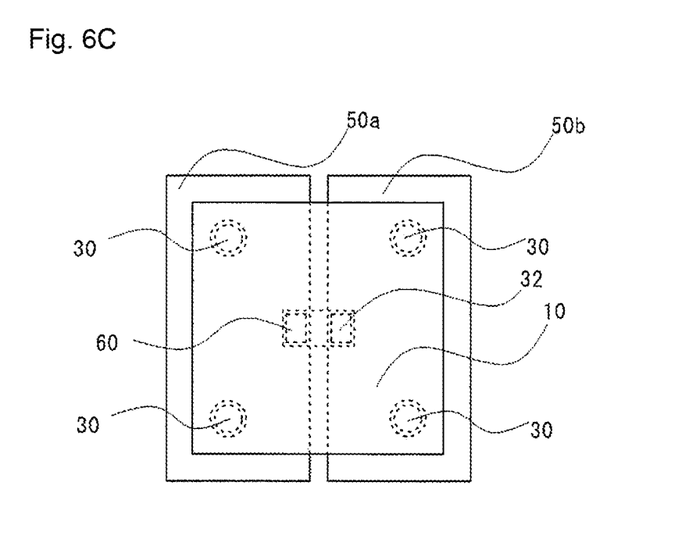

Next as shown in FIG. 5C and FIG. 6C, the light emitting element 10 shown in FIG. 4C is placed above the protective element 60 and on the electrically conductive wirings 50a, 50b via flux so that in a top view, the protective element 60 is totally under the light emitting element 10. As shown in FIG. 5B, placing in a flip-chip manner allows for establishing electrical connection with the electrically conductive wirings 50a, 50b, and thus preferable.

Then, heat is applied in an inert atmosphere such as in nitrogen gas, the protective element 60 and the light emitting element 10 shown in FIG. 4C are metal-joined with the electrically conductive wiring 50a, 50b.

(Filling Light Reflecting Resin)

Figure 5D:
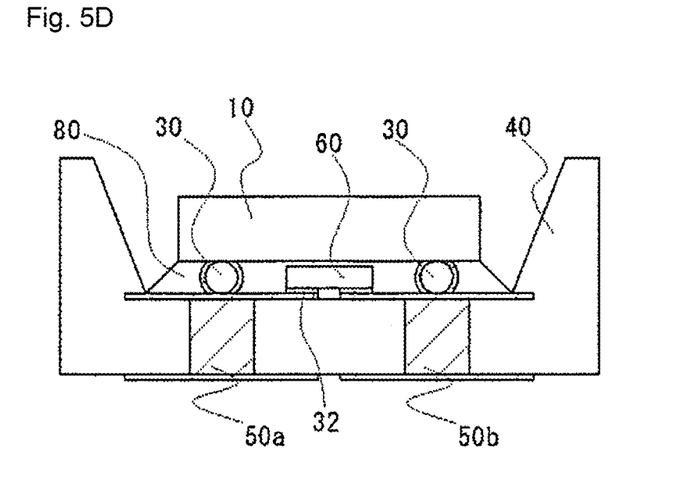
Figure 5E:
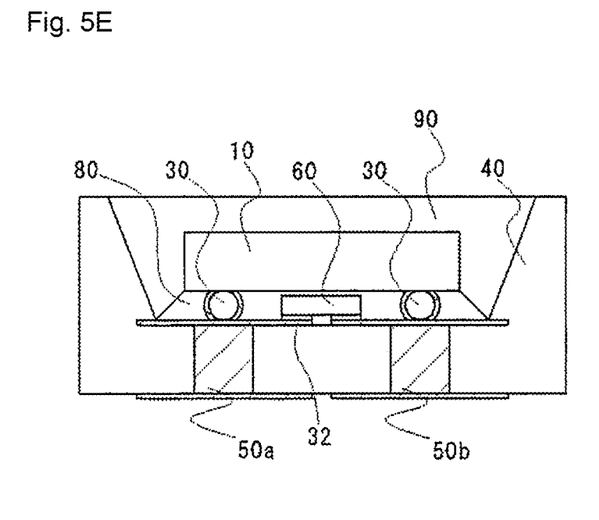
Figure 6D:
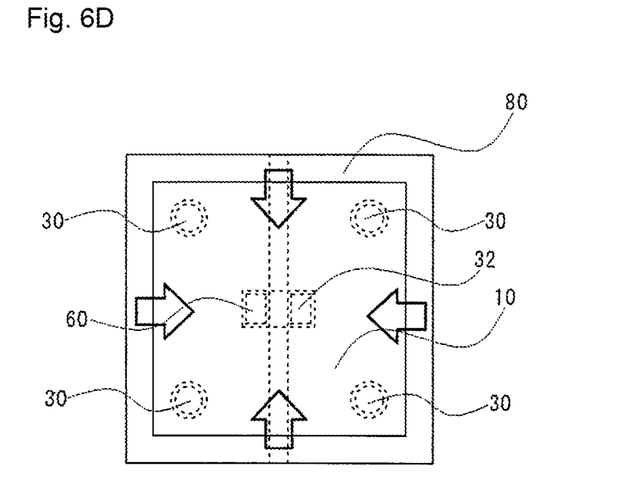

Next, as shown in FIG. 5D and FIG. 6D, a light reflecting resin 80 is filled in the space between the light emitting element 10 shown in FIG. 4C and the electrically conductive wirings 50a, 50b, and then hardened. As show in FIGS. 5A to 5E, in the case where the base member defined a recess, the filling is preferably performed by using a potting method. With this, the light reflecting resin can be filled in the space easily. The base member has a flat surface, which facilitates filling of the resin while avoiding occurrence of void therein. That is, in the case where the protective element is mounted in the recess of the base member, the entering route of the light reflecting resin is limited to the opening of the recess, which hinders the filling of the rein. However, in the present embodiment, the protective element is placed over the flat base member, raised by the first electrically conductive joining member to create a space, so that as shown by arrows in FIG. 6D, the resin can be filled from any direction of the side surfaces of the protective element. Accordingly, even in the case a distance between the lower surface of the light emitting element and the upper surface of the protective element is very small, the light reflecting resin 80 can be disposed appropriately.

(Forming Light-Transmissive Layer)

Finally, as shown in FIG. 5E, a light-transmissive layer 90 is formed in (the recess of) the base member 40. In the case of forming the light-transmissive layer with a resin, a screen printing method, a potting method, a transfer molding method, a compression molding method, an injection molding method, or the like, can be used. The light-transmissive layer may be formed by spray coating a resin. In the case where the light-transmissive layer is made of a glass or the like, it may be bonded directly or via an adhesive agent to the light emitting element. A fluorescent material to covert wavelength of light may be contained.

Second Embodiment

Figure 7A:
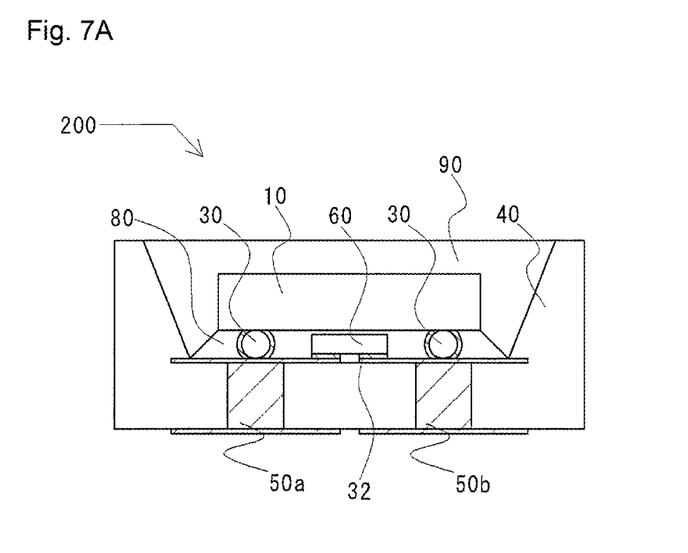
FIG. 7A is a schematic cross-sectional view and FIG. 7B is a schematic plan view each showing a light emitting device according to a second embodiment.
Figure 7B:
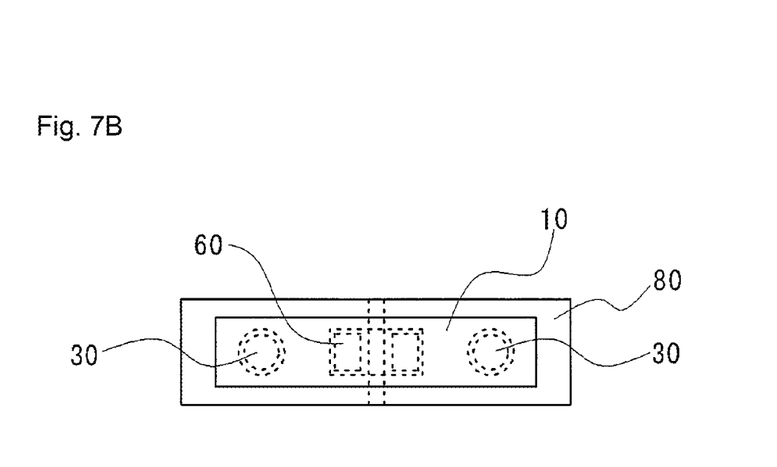

In the first embodiment, the first electrically conductive joining member is arranged at the four corners of the light emitting element, but the first electrically conductive member may be arranged at least two portions on the light emitting element. For examples, as shown in FIG. 7A (a cross-sectional view) and FIG. 7B (a plan view), the first electrically conductive joining member may be arranged at two portions. Accordingly, the light emitting device 200 which has a further smaller size can be provided.

Third Embodiment

Figure 8A:
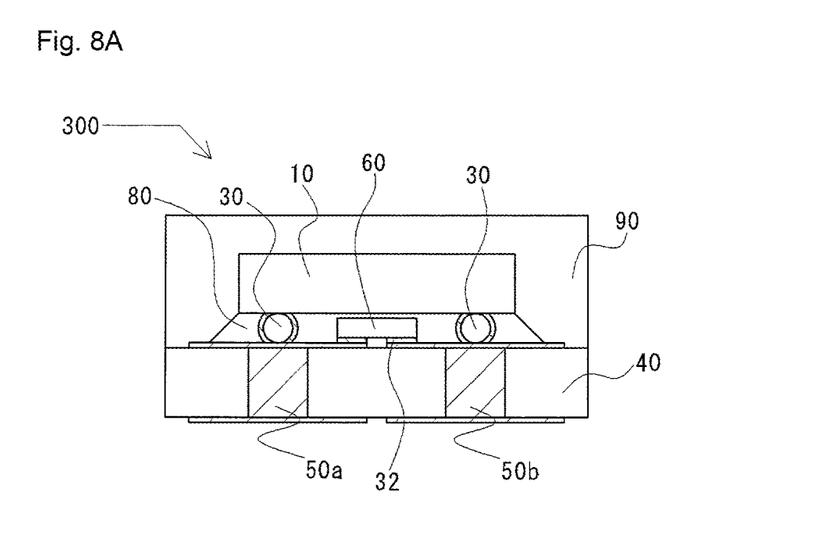
FIG. 8A is a schematic cross-sectional view and FIG. 8B is a schematic plan view each showing a light emitting device according to a third embodiment.
Figure 8B:
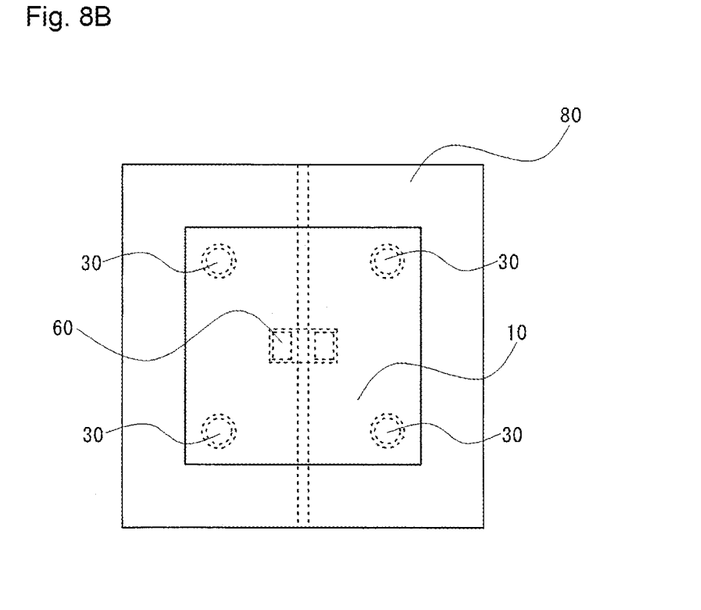

The shape of the base member is not specifically limited and as shown in FIG. 8A (a cross-sectional view) and FIG. 8B (a plan view), a plate-like shape with flat surfaces may be employed. In the first embodiment, the light reflecting resin 80 and the light-transmissive layer 90 are preferably filled by using a potting method, but in the light emitting device 300 of the third embodiment, the light reflecting resin 80 and the light transmissive layer 90 can be formed by using a potting method, a transfer molding method, a compression molding method, an injection molding, or the like.

Fourth Embodiment

Figure 9:
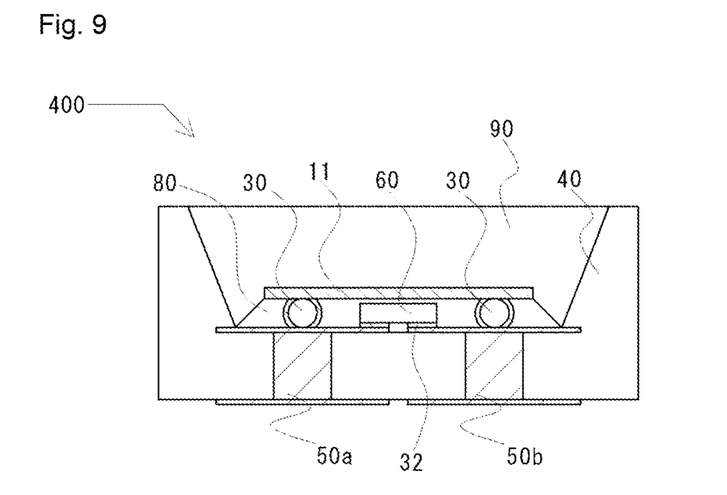
FIG. 9 is a schematic cross-sectional view of a light emitting element according to a fourth embodiment.

As shown in FIG. 9 (a cross-sectional view), the growth substrate (sapphire etc.) of the light emitting element 10 is removed to expose the semiconductor layer 11 to the surface. Thus, the light emitting device 400 having a further reduced height, while achieving higher light extraction efficiency can be obtained.

Embodiments of the present invention can be utilized for various kinds of light sources, such as illumination light sources, light sources for various kinds of indicators, light sources for automobile use, light sources for displays, back light sources for liquid crystal displays, signals, automobile use, channel control characters for channel boards. It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
   a base member;
   at least one first electrically conductive joining member that is directly connected to an upper surface of the base member;
   a light emitting element disposed on the upper surface of the base member via the at least one first electrically conductive joining member such that a space is located between a lower surface of the light emitting element and the upper surface of the base member;
   at least one second electrically conductive joining member that is connected to the upper surface of the base member; and
   a protective element disposed on the upper surface of base member via the at least one second electrically conductive joining member, the protective element being located directly under the light emitting element;
   wherein the protective element is located in the space,
   wherein a light reflecting resin is located in the space and covers the protective element, and
   wherein the at least one first electrically conductive joining member is at least partially located within the light reflecting resin.

2. The light emitting device according to claim 1, wherein the light emitting element and the protective element are mounted on a same surface side of the base member.

3. The light emitting device according to claim 1, wherein the at least one first electrically conductive joining member includes a core and a coating outside of the core, and a melting point of the core is higher than a melting point of the coating.

4. The light emitting device according to claim 2, wherein the at least one first electrically conductive joining member includes a core and a coating outside of the core, and a melting point of the core is higher than a melting point of the coating.

5. The light emitting device according to claim 3, wherein the core comprises Cu and the coating is made of an alloy containing Au and at least one of Si, Ge, and Sn.

6. The light emitting device according to claim 4, wherein the core comprises Cu and the coating is made of an alloy containing Au and at least one of Si, Ge, and Sn.

7. The light emitting device according to claim 3, wherein the base member includes an electrically conductive wiring at its upper surface, and the electrically conductive wiring and the coating are bonded through eutectic bonding.

8. The light emitting device according to claim 4, wherein the base member includes an electrically conductive wiring at its upper surface, and the electrically conductive wiring and the coating are bonded through eutectic bonding.

9. The light emitting device according to claim 5, wherein the base member includes an electrically conductive wiring at its upper surface, and the electrically conductive wiring and the coating are bonded through eutectic bonding.

10. The light emitting device according to claim 6, wherein the base member includes an electrically conductive wiring at its upper surface, and the electrically conductive wiring and the coating are bonded through eutectic bonding.

11. The light emitting device according to claim 3, wherein a height of the core is higher than a height of the protective element.

12. The light emitting device according to claim 4, wherein a height of the core is higher than a height of the protective element.

13. The light emitting device according to claim 5, wherein a height of the core is higher than a height of the protective element.

14. The light emitting device according to claim 6, wherein a height of the core is higher than a height of the protective element.

15. The light emitting device according to claim 1, wherein the protective element is spaced from the light emitting element.

16. A light emitting device comprising:
   a base member;
   at least one first electrically conductive joining member that is directly connected to an upper surface of the base member;
   a light emitting element disposed on the base member via the at least one first electrically conductive joining member, the at least one first electrically conductive joining member being located directly under the light emitting element;
   at least one second electrically conductive joining member that is connected to the upper surface of the base member; and
   a protective element disposed on the base member via the at least one second electrically conductive joining member, the protective element being located directly under the light emitting element,
   wherein the at least one first electrically conductive joining member is a Cu-core ball, wherein a height of the first electrically conductive joining member is greater than a height of the protective element, wherein a light reflecting resin covers the protective element, and wherein the at least one first electrically conductive joining member is at least partially located within the light reflecting resin.

17. The light emitting device according to claim 16, wherein the light emitting element and the protective element are mounted on a same surface side of the base member.

18. The light emitting device according to claim 16, wherein the at least one first electrically conductive joining member includes a Cu core and a coating outside of the Cu core.

19. The light emitting device according to claim 18, wherein a melting point of the Cu core is higher than a melting point of the coating.

20. The light emitting device according to claim 18, wherein the coating is made of an alloy containing Au and at least one of Si, Ge, and Sn.

21. The light emitting device according to claim 18, wherein the base member includes an electrically conductive wiring at its upper surface, and the electrically conductive wiring and the coating are bonded through eutectic bonding.

22. The light emitting device according to claim 16, wherein the protective element is spaced from the light emitting element.

* * * * *